(12) United States Patent
Sano

(10) Patent No.: US 12,237,270 B2
(45) Date of Patent: Feb. 25, 2025

(54) FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 471 days.

(21) Appl. No.: 17/664,067

(22) Filed: May 19, 2022

(65) Prior Publication Data

US 2022/0278046 A1 Sep. 1, 2022

Related U.S. Application Data

(63) Continuation of application No. PCT/JP2020/039171, filed on Oct. 16, 2020.

(30) Foreign Application Priority Data

Nov. 28, 2019 (JP) .................................. 2019-215208

(51) Int. Cl.
*H01L 23/538* (2006.01)

(52) U.S. Cl.
CPC ...... *H01L 23/5387* (2013.01); *H01L 23/5386* (2013.01)

(58) Field of Classification Search
CPC ... H01L 23/5387; H01L 23/5386; H05K 1/02; H05K 3/28
See application file for complete search history.

(56) References Cited

U.S. PATENT DOCUMENTS

| | | | |
|---|---|---|---|
| 2011/0169393 A1* | 7/2011 | Gyoda | H10K 59/90 313/46 |
| 2014/0041999 A1 | 2/2014 | Yim et al. | |
| 2017/0003440 A1* | 1/2017 | Kim | H05K 1/0283 |
| 2017/0288005 A1 | 10/2017 | Kawata | |
| 2019/0013275 A1* | 1/2019 | Sunshine | H01L 23/5387 |
| 2021/0013431 A1 | 1/2021 | Kawata et al. | |

FOREIGN PATENT DOCUMENTS

| | | | |
|---|---|---|---|
| JP | 2003-322864 A | 11/2003 | |
| JP | 2014-038589 A | 2/2014 | |
| JP | 2017-187580 A | 10/2017 | |
| JP | 2018-022808 A | 2/2018 | |
| JP | 2018-132655 A | 8/2018 | |
| JP | 2019-175924 A | 10/2019 | |
| WO | WO 2019/187568 * | 3/2019 | ............... G09F 9/00 |

OTHER PUBLICATIONS

International Search Report issued Dec. 15, 2020 in PCT/JP2020/039171 filed on Oct. 16, 2020, 4 pages.

* cited by examiner

*Primary Examiner* — Thanh T Nguyen
(74) *Attorney, Agent, or Firm* — Maier & Maier, PLLC

(57) ABSTRACT

According to one embodiment, a flexible substrate includes an array substrate including an insulating basement having a first surface and a second surface opposed to the first surface, a first organic insulating layer which is located alongside the second surface and which is closely adhered the array substrate, and a second organic insulating layer closely adhered the first organic insulating layer. The first organic insulating layer is located between the array substrate and the second organic insulating layer. A plurality of bubbles is mixed in the second organic insulating layer. The second organic insulating layer has an elastic modulus that is lower than that of the insulating basement.

16 Claims, 12 Drawing Sheets

| Thickness | Elastic modulus | Rigidity |
|---|---|---|
| 150μm | 100MPa | 28125000 |
| 100μm | 100MPa | 8333333 |
| 50μm | 100MPa | 1041667 |
| 150μm | 10MPa | 2812500 |
| 100μm | 10MPa | 833333.3 |
| 50μm | 10MPa | 104166.7 |
| 150μm | 1MPa | 281250 |
| 100μm | 1MPa | 83333.33 |
| 50μm | 1MPa | 10416.67 |
| 150μm | 0.1MPa | 28125 |
| 100μm | 0.1MPa | 8333.333 |
| 50μm | 0.1MPa | 1041.667 |
F I G. 6
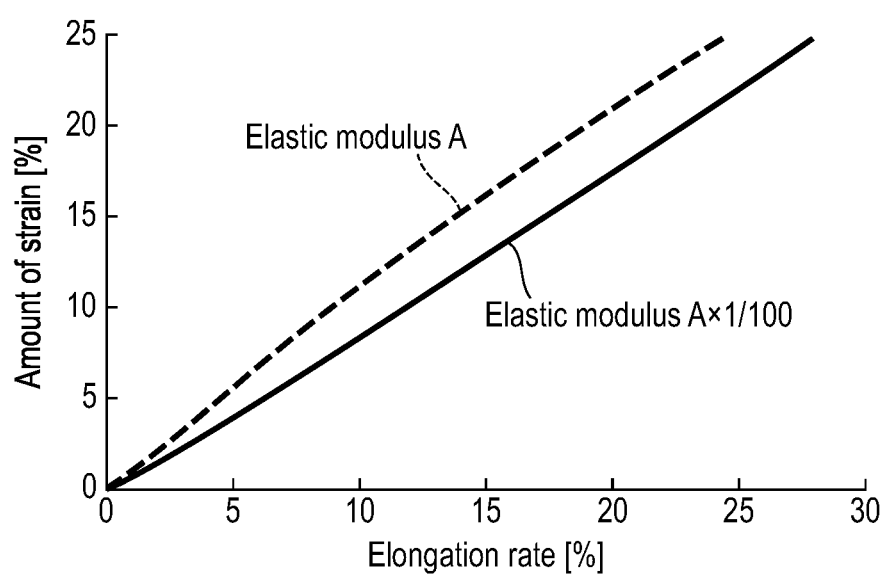
F I G. 7

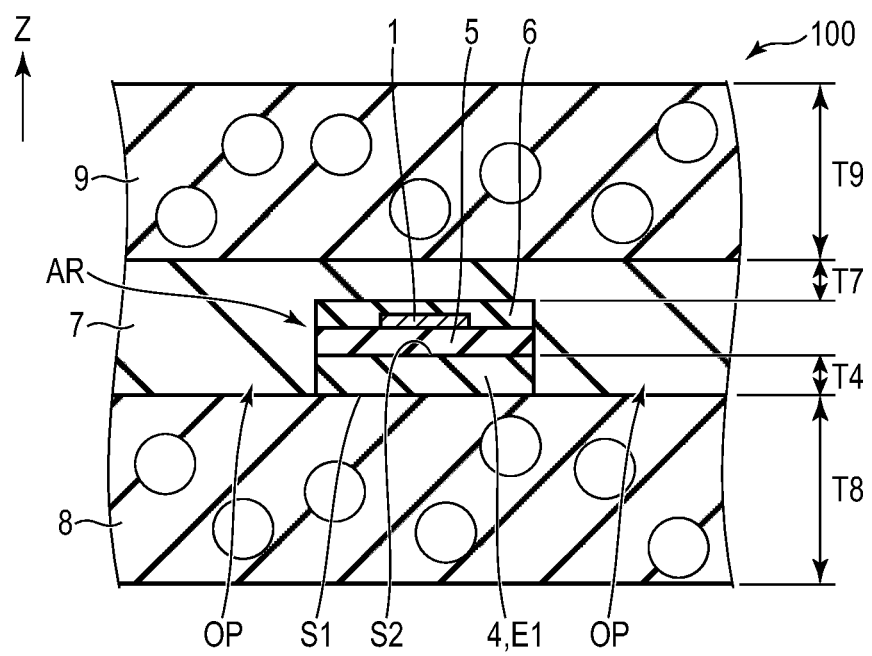
F I G. 10

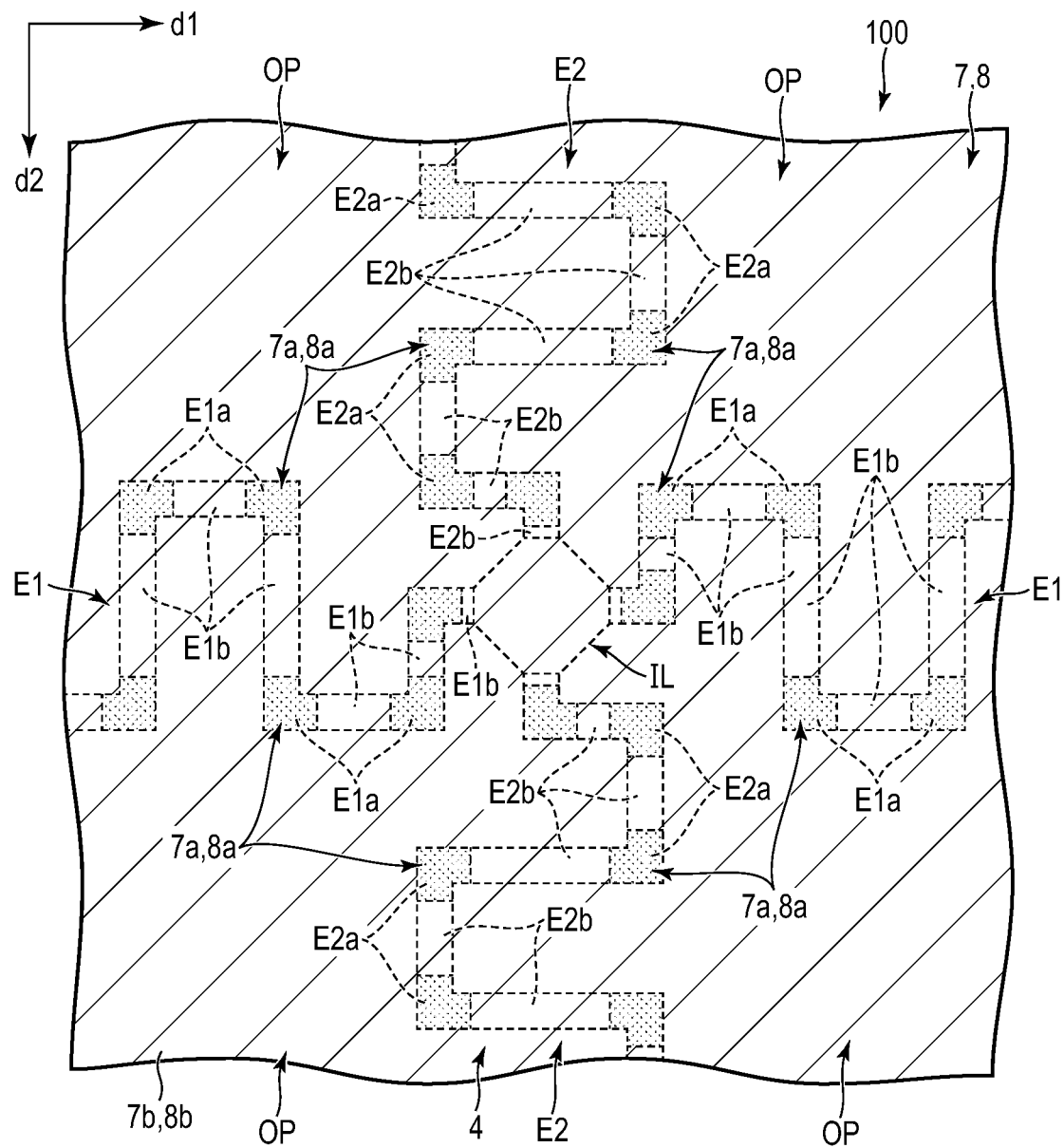
F I G. 15

FLEXIBLE SUBSTRATE

CROSS-REFERENCE TO RELATED APPLICATIONS

This application is a Continuation Application of PCT Application No. PCT/JP2020/039171, filed Oct. 16, 2020 and based upon and claiming the benefit of priority from Japanese Patent Application No. 2019-215208, filed Nov. 28, 2019, the entire contents of all of which are incorporated herein by reference.

FIELD

Embodiments described herein relate generally to a flexible substrate.

BACKGROUND

In recent years, the use of flexible substrates having flexibility and elasticity has been studied in a variety of fields. As one example of the use, a flexible substrate in which electrical elements are arranged in a matrix is attached to a curved surface of the housing of an electronic device, a human body and the like. As the electrical elements, a variety of sensors such as a touch sensor and a temperature sensor and a display element can be applied.

In the flexible substrates, it is necessary to take measures to prevent lines to be damaged by stress due to flexing and stretching. As such measures, it has been proposed to provide a honeycomb-shaped opening in a basement that supports the wiring lines, to form the wiring lines in a meandering shape, and the like.

BRIEF DESCRIPTION OF THE DRAWINGS

FIG. 6 is a table showing the relationship among the thickness, elastic modulus and rigidity of an organic insulating layer.

FIG. 7 is a graph showing variations of the amount of strain with respect to the elongation rate of the flexible substrate when the elastic modulus of the organic insulating layer is changed.

FIG. 10 is a sectional view showing part of a flexible substrate according to a third modification of the first embodiment.

FIG. 15 is an enlarged plan view showing part of a flexible substrate according to a first modification of the second embodiment.

DETAILED DESCRIPTION

Figure 1:
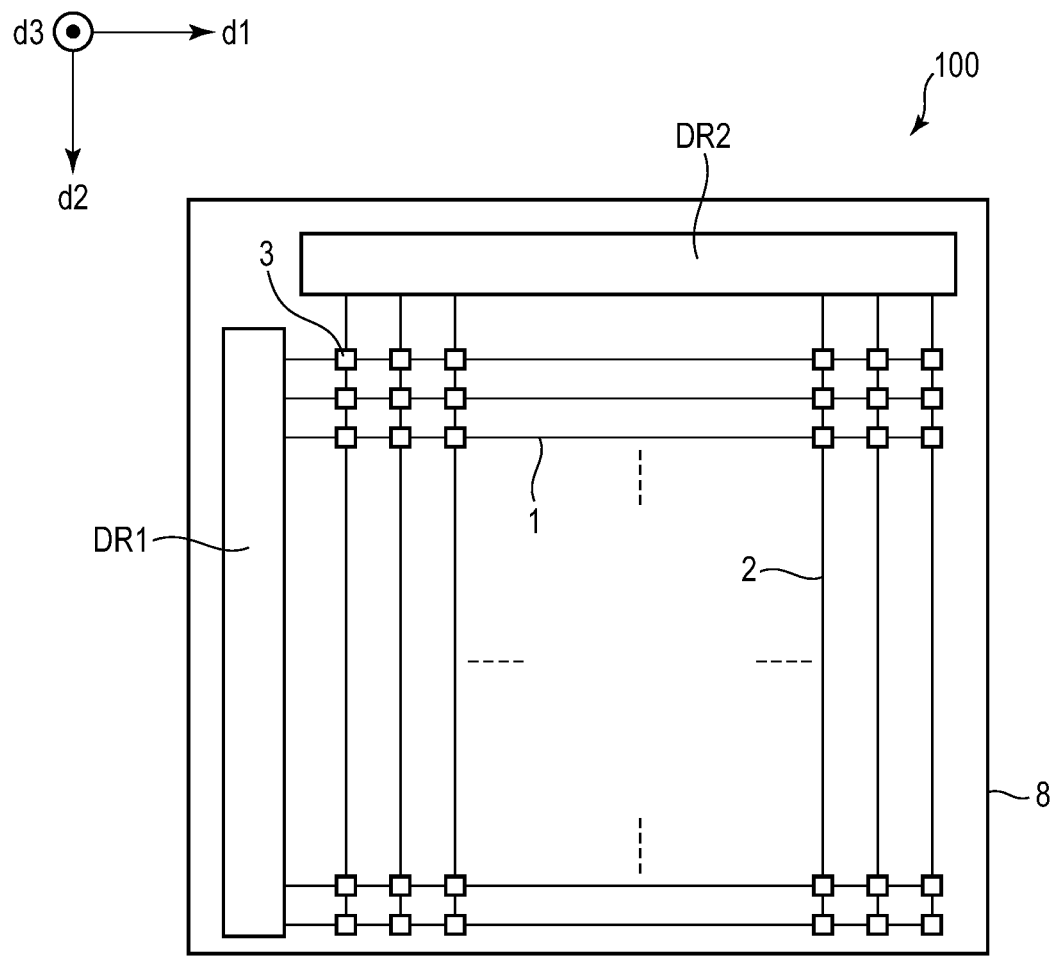
FIG. 1 is a plan view showing a flexible substrate according to a first embodiment.

In general, according to one embodiment, there is provided a flexible substrate comprising: an array substrate including an insulating basement having a first surface and a second surface opposed to the first surface; a first organic insulating layer which is located alongside the second surface and which is closely adhered the array substrate; and a second organic insulating layer closely adhered the first organic insulating layer, the first organic insulating layer being located between the array substrate and the second organic insulating layer. A plurality of bubbles are mixed in the second organic insulating layer. The second organic insulating layer has an elastic modulus that is lower than that of the insulating basement.

According to another embodiment, there is provided a flexible substrate comprising: an array substrate including an insulating basement having a first surface and a second surface opposed to the first surface; and a first organic insulating layer which is located alongside the second surface and which is fixed to the array substrate directly or indirectly. The insulating basement includes a plurality of islands each constituting part of the first surface and part of the second surface, a plurality of extensions each constituting part of the first surface and part of the second surface, and a plurality of openings each surrounded by the islands and the extensions. The extensions are each located between two of the islands and each include a curved or bent first section and a second section other than the first section. The first organic insulating layer includes a plurality of first portions which overlap the first sections of the extensions and a second portion other than the first portions. The second portion has rigidity that is lower than that of the first portions.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like ref-

First Embodiment

First, a first embodiment will be described. FIG. 1 is a plan view showing a flexible substrate 100 according to the first embodiment.

As shown in FIG. 1, in the first embodiment, a first direction d1, a second direction d2 and a third direction d3 are defined. The first and second directions d1 and d2 are parallel to the main surface of the flexible substrate 100 and intersect each other. The third direction d3 is perpendicular to the first and second directions d1 and d2, and corresponds to the thickness direction of the flexible substrate 100. Although the first and second directions d1 and d2 are orthogonal to each other in the first embodiment, they may intersect at an angle other than 90°.

The flexible substrate 100 includes a plurality of wiring lines, a plurality of electrical elements 3, an organic insulating layer 8, a scanning line driver DR1 and a signal line driver DR2. In the first embodiment, the wiring lines include a plurality of scanning lines 1 and a plurality of signal lines 2. The scanning lines 1, the signal lines 2, the electrical elements 3, the scanning line driver DR1 and the signal line driver DR2 are located on the organic insulating layer 8. The scanning lines 1 extend in the first direction d1 and are arranged in the second direction d2. The scanning lines 1 are connected to the scanning line driver DR1. The signal lines 2 extend in the second direction d2 and are arranged in the first direction d1. The signal lines 2 are connected to the signal line driver DR2. The electrical elements 3 are located at their respective intersections of the scanning lines 1 and the signal lines 2, and are electrically connected to the scanning lines 1 and the signal lines 2. The function of the electrical elements 3 will be described in detail later.

Figure 2:
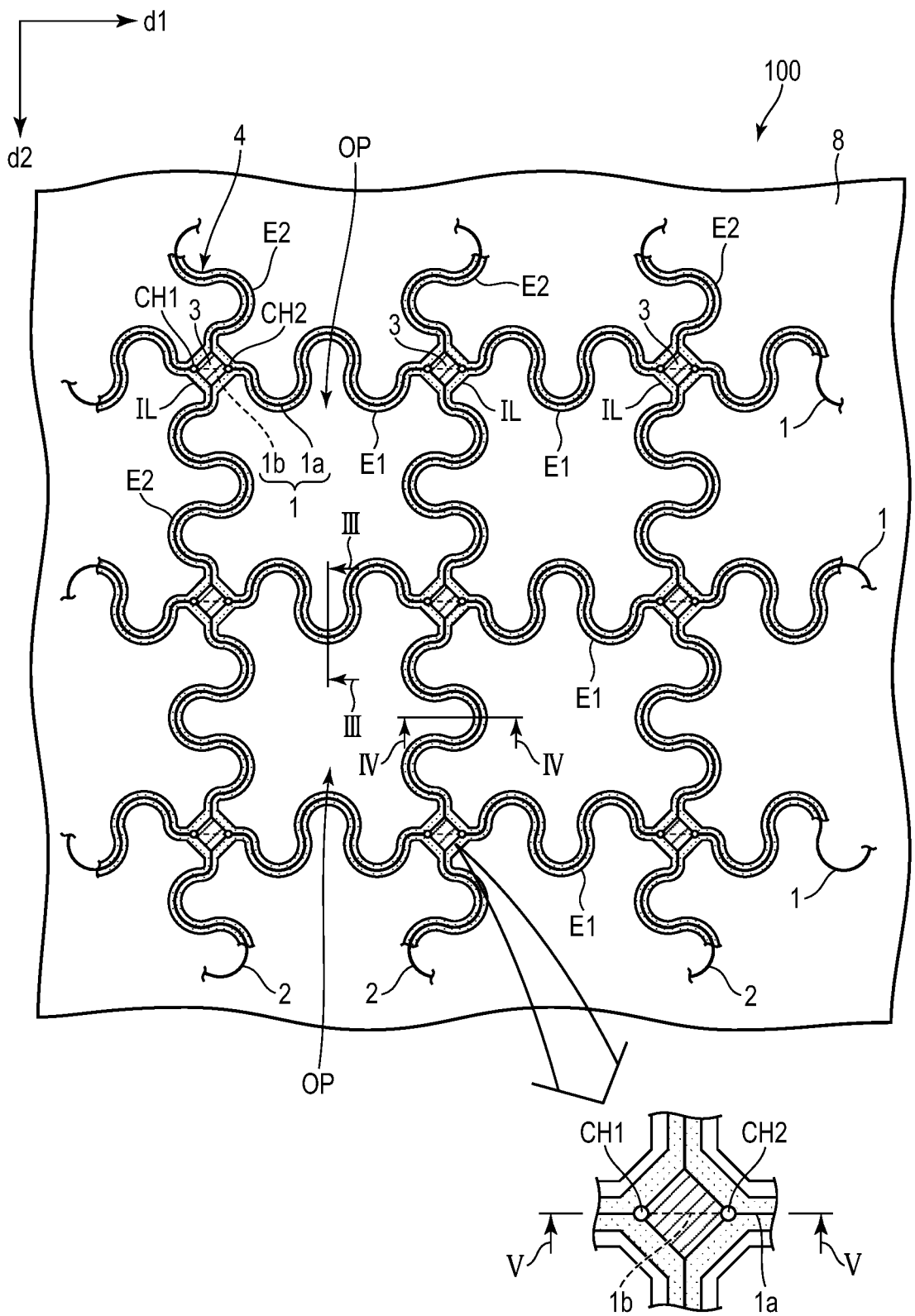
FIG. 2 is an enlarged plan view showing part of the flexible substrate shown in FIG. 1.

FIG. 2 is an enlarged plan view showing part of the flexible substrate 100 shown in FIG. 1. As shown in FIG. 2, the flexible substrate 100 further includes an insulating basement 4 for supporting the scanning lines 1 and 2 and the like. The insulating basement 4 has elasticity and flexibility. The insulating basement 4 is formed of, for example, polyimide; however, it is not limited to the example but may be formed of other insulating materials.

The insulating basement 4 is formed in a network shape. The insulating basement 4 includes a plurality of islands IL, a plurality of extensions E1, a plurality of extensions E2 and a plurality of openings OP. The islands IL, extensions E1 and extensions E2 are formed integrally as one unit. The islands IL are spaced from one another. In the first embodiment, the islands IL are arranged in a matrix in the first direction d1 and the second direction d2.

The extensions E1 are intermittently arranged in the first direction d1 and are spaced in the second direction d2. Each of the extensions E1 extends in the first direction d1 and has a waveshape. Each of the extensions E1 is loosely bridged two islands IL adjacent in the first direction d1. Therefore, the extensions E1 do not linearly connect the two islands IL at the shortest distance.

The extensions E2 are arranged intermittently arranged in the second direction d2 and are spaced in the first direction d1. Each of the extensions E2 extends in the second direction d2 and has a waveshape. Each of the extensions E2 is loosely bridged two islands IL adjacent in the second direction d2.

In the first embodiment, the extensions E1 and E2 each have a curved section. However, as will be described later with reference to FIG. 14, the extensions E1 and E2 each may have a bent section.

The openings OP are surrounded by the islands IL and the extensions E1 and E2. In the first embodiment, each of the openings OP is surrounded by a pair of extensions E1 adjacent in the second direction d2, a pair of extensions E2 adjacent in the first direction d1 and four islands IL connected to the pair of extensions E1 and the pair of extensions E2. The openings OP are arranged in a matrix in the first direction d1 and the second direction d2.

The scanning lines 1 are located on the islands IL and the extensions E1 which are continuous in the first direction d1, and extend along the extensions E1 and islands IL. In the first embodiment, the scanning lines 1 each have a waveshape. The signal lines 2 are located on the islands IL and the extensions E2 which are continuous in the second direction d2, and extend along the extensions E2 and islands IL. In the first embodiment, the signal lines 2 each have a waveshape. The scanning lines 1 and the signal lines 2 are an example of wiring lines included in the flexible substrate 100. The scanning lines 1 and the signal lines 2 can be formed of, for example, metal materials and transparent conductive materials, and may have a single-layer structure and a laminated structure. The flexible substrate 100 may include another type of line such as a power supply line for supplying power to the electrical elements 3 in addition to the scanning lines 1 and the signal lines 2.

The scanning lines 1 each have first portions 1a and second portions 1b. The first portion 1a is indicated by a solid line, and the second portion 1b is indicated by a dashed line. The second portion 1b is superposed on its corresponding electrical element 3. The first portions 1a and the second portion 1b are arranged in different layers and electrically connected through contact holes CH1 and CH2.

The electrical elements 3 are each electrically connected to its corresponding lines. In the first embodiment, the electrical elements 3 are each electrically connected to one scanning line 1 and one signal line 2.

The scanning lines 1 each supply a scanning signal to its corresponding electrical element 3. If the electrical elements 3 are ones that output signal, such as sensors, they supply output signals to the signal lines 2. If, furthermore, the electrical elements 3 operate in response to an input signal, such as light-emitting elements and actuators, drive signals are supplied to the signal lines 2. A controller including a source of the scanning signals, a source of drive signals, a processor for processing output signals, and the like, may be provided on the flexible substrate 100 and on a device connected to the flexible substrate 100.

The electrical elements 3 are located on the islands IL. The electrical element 3 is smaller than the island IL and in FIG. 2 the island IL protrude from the edges of the electrical element 3. The electrical elements 3 are, for example, sensors, semiconductor elements and actuators. The sensors may include, for example, an optical sensor which receives visible light and near-infrared light, a temperature sensor, a pressure sensor and a touch sensor. The semiconductor elements may include, for example, a light-emitting element, a light-receiving element, a diode and a transistor.

When the electrical elements 3 are light-emitting elements, a flexible display having flexibility and elasticity can be achieved. As the light-emitting element, for example, a mini LED, a light-emitting diode having a size of about 100 μm, such as a micro LED, or an organic electroluminescent element can be used.

When the electrical elements 3 are actuators, for example, piezoelectric elements can be applied. Note that the electrical elements 3 are not limited to the ones exemplified here, but other elements having various functions can be applied. The electrical elements 3 may be capacitors and resistors. In addition, the arrangement or shape of the electrical elements 3 is not limited to the example shown in FIG. 2.

Figure 3:
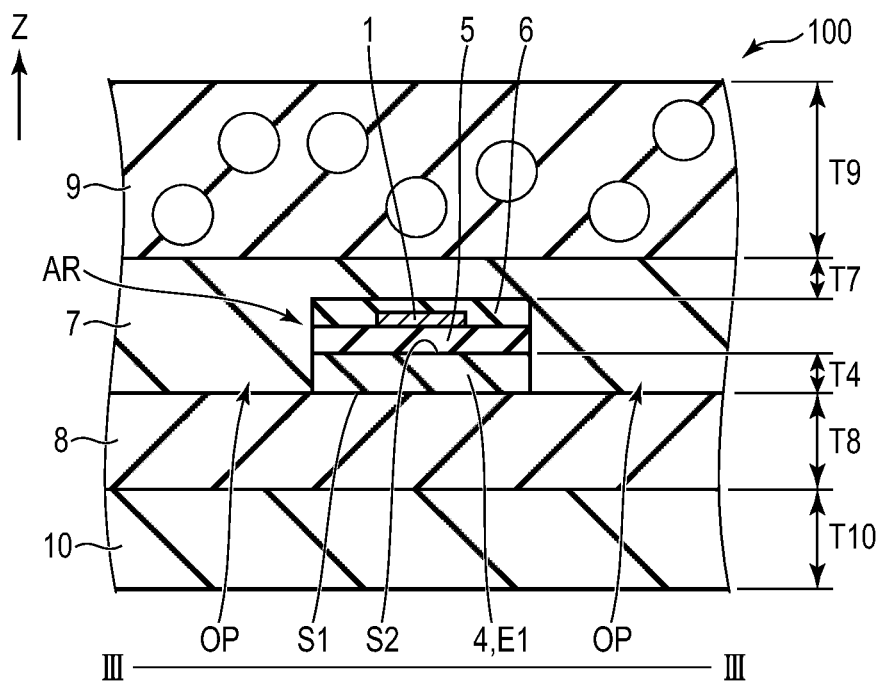
FIG. 3 is a sectional view showing part of the flexible substrate along line III-III of FIG. 2.

FIG. 3 is a sectional view showing part of the flexible substrate 100 along line III-III of FIG. 2.

As shown in FIG. 3, the flexible substrate 100 further includes organic insulating layers 5, 6, 7, 8, 9 and 10. The insulating basement 4 has a first surface S1 and a second surface S2 opposed to the first surface S1. The extension E1 constitutes part of the first surface S1 and part of the second surface S2. The organic insulating layer 5 covers the second surface S2 of the insulating basement 4. The scanning line 1 is provided alongside the second surface S2 of the insulating basement 4. Specifically, the scanning line 1 is placed on the organic insulating layer 5.

The organic insulating layer 6 covers the scanning line 1 and the organic insulating layer 5. The organic insulating layer 5 and the organic insulating layer 6 are formed of an organic material such as polyimide. Although the organic insulating layer 5 and the organic insulating layer 6 are provided only directly above the insulating basement 4 (island IL, extension E1 and extension E2), they may be provided in an area where the insulating basement 4 does not exist (an area overlapping the opening OP). However, from the viewpoint of flexibility and elasticity of the flexible substrate 100, the arrangement as shown in FIG. 3 is preferable. In the example shown in FIG. 3, the signal line 2 is not disposed directly above the extension E1. The insulating basement 4, organic insulating layer 5, organic insulating layer 6, scanning line 1 and the like constitute an array substrate AR.

The organic insulating layer 7 is located alongside the second surface S2 of the insulating basement 4 and is closely adhered the array substrate AR. The organic insulating layer 7 covers the insulating basement 4, the organic insulating layer 5 and the organic insulating layer 6. That is, the organic insulating layer 7 covers the array substrate AR. The organic insulating layer 8 is located alongside the first surface S1 of the insulating basement 4 and is closely adhered the array substrate AR. The organic insulating layer 7 and the organic insulating layer 8 are closely adhered each other through the openings OP. The organic insulating layer 7 is located between the array substrate AR and the organic insulating layer 9. The organic insulating layer 9 is closely adhered the organic insulating layer 7. The organic insulating layer 8 is located between the array substrate AR and the organic insulating layer 10. The organic insulating layer 10 is closely adhered the organic insulating layer 8.

In the first embodiment, the organic insulating layer 7 functions as a first organic insulating layer, the organic insulating layer 9 functions as a second organic insulating layer, the organic insulating layer 8 functions as a third organic insulating layer, and the organic insulating layer 10 functions as a fourth organic insulating layer. The organic insulating layers 7 to 10 are formed of a flexible organic material.

Figure 4:
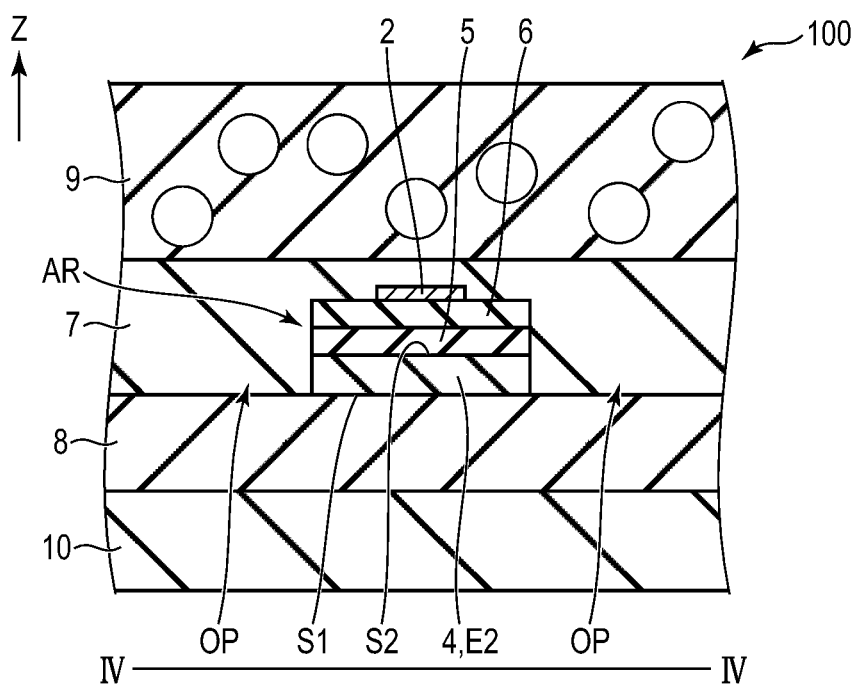
FIG. 4 is a sectional view showing part of the flexible substrate along line IV-IV of FIG. 2.

FIG. 4 is a sectional view showing part of the flexible substrate 100 along line IV-IV of FIG. 2.

As shown in FIG. 4, the extension E2 constitutes part of the first surface S1 and part of the second surface S2. The signal line 2 is provided alongside the second surface S2 of the insulating basement 4. Specifically, the signal line 2 is placed on the organic insulating layer 6. The organic insulating layer 7 covers the insulating basement 4, organic insulating layer 5, organic insulating layer 6 and signal line 2. That is, the organic insulating layer 7 covers the array substrate AR. In the example shown in FIG. 4, the scanning line 1 is not disposed directly above the extension E2. As shown in FIGS. 3 and 4, the insulating basement 4, organic insulating layer 5, scanning line 1, organic insulating layer 6 and signal line 2 are surrounded by the organic insulating layers 7 and 8. The signal line 2 also constitutes the array substrate AR.

Figure 5:
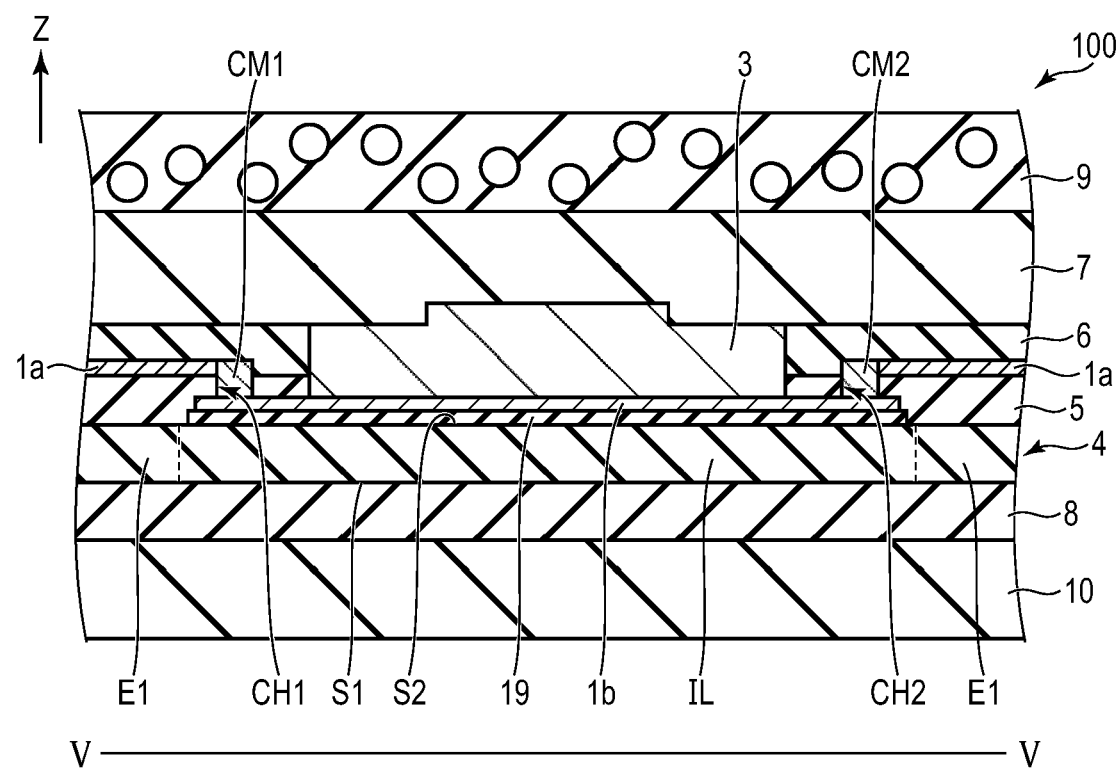
FIG. 5 is a sectional view showing part of the flexible substrate along line V-V of FIG. 2.

FIG. 5 is a sectional view showing part of the flexible substrate 100 along line V-V of FIG. 2. As shown in FIG. 5, the island IL constitutes part of the first surface S1 and part of the second surface S2. The electrical element 3 is provided alongside the second surface S2 of the corresponding island IL among the islands IL of the insulating basement 4.

An inorganic insulating layer 19 (passivation layer) is placed between the electrical element 3 and the island IL. The inorganic insulating layer 19 is shaped like an island superposed on the electrical element 3 (or the island IL) in planar view. The first portions 1a are placed on the organic insulating layer 5 and covered with the organic insulating layer 6. The second portion 1b is placed on the inorganic insulating layer 19 and is electrically connected to the electrical element 3. In the example shown in FIG. 5, both ends of the second portion 1b are covered with the organic insulating layer 5.

The contact holes CH1 and CH2 are formed in the organic insulating layer 5. In the figure, one of the first portions 1a is electrically connected to the second portion 1b via a connection member CM1 disposed in the contact hole CH1. Another first portion 1a is electrically connected to the second portion 1b via a connection member CM2 disposed in the contact hole CH2. Each of the connection members CM1 and CM2 may be part of the first portion 1a or may be provided separately from the first portion 1a.

As described above, the island-shaped inorganic insulating layer 19 is placed between the electrical element 3 and the insulating basement 4. The inorganic insulating layer 19 functions as a protective film which prevents moisture and the like from entering the electrical element 3 and the second portion 1b of the scanning line 1. The flexible substrate 100 can thus be improved in its reliability. In general, inorganic films are more susceptible to cracks than organic films; however, since the inorganic insulating layer 19 is not provided under the first portion 1a of the scanning line 1, the scanning line 1 can be prevented from being disconnected in the first portion 1a. The same holds true of the signal lines 2. Furthermore, compared with the case where the inorganic insulating layer 19 is provided all over the flexible substrate 100, the elasticity and flexibility of the flexible substrate 100 are less inhibited.

In the scanning line 1, the second portion 1b superposed on the electrical element 3 is placed on a layer other than the first portion 1a. The array substrate AR can thus be improved in the degree of design freedom in the vicinity of the electrical element 3. The contact holes CH1 and CH2 are provided above the inorganic insulating layer 19. Since the first portion 1a and the second portion 1b are connected to each other above the inorganic insulating layer 19, the connection can be prevented from becoming poor. The island IL of the insulating basement 4 is disposed under the electrical element 3. The electrical element 3 can thus be supported satisfactorily.

The inorganic insulating layer 19, connection members CM1 and CM2, and electrical element 3 also constitute the array substrate AR.

The organic insulating layers 7 to 10 shown in FIGS. 3 to 5 will be described below in detail.

As shown in FIG. 3, the organic insulating layers 7 to 10 have elasticity and flexibility. The organic insulating layers 7 to 10 are each formed of a material whose elastic modulus is lower than that of the insulating basement 4. In the first embodiment, the organic insulating layers 7 to 10 are formed of the same material. As elastic materials (organic insulating materials) for forming the organic insulating layers 7 to 10, for example, any one of an acrylic resin, a urethane resin and an epoxy resin can be used.

The organic insulating layers 7, 8 and 10 are each a solid layer. A plurality of bubbles are mixed randomly in the organic insulating layer 9. From the viewpoint of balancing the rigidity of the organic insulating layer 9, it is preferable that the bubbles are mixed uniformly in the organic insulating layer 9.

Assume that the thickness of the insulating basement 4 is T4, that of the organic insulating layer 7 is T7, that of the organic insulating layer 8 is T8, that of the organic insulating layer 9 is T9 and that of the organic insulating layer 10 is T10. In the first embodiment, the thickness T9 is larger than the thickness T7.

As shown in FIGS. 3 and 4, it is preferable that the sum of the thickness T7 and the thickness T9 is equal to the sum of the thickness T4, the thickness T8 and the thickness T10 in the area superposed on the scanning line 1 and the area superposed on the signal line 2 (T7+T9=T4+T8+T10). This makes it possible to arrange the scanning line 1 and signal line 2 in the vicinity of the neutral plane of the flexible substrate 100, with the result that stress is hardly applied to the scanning line 1 and signal line 2.

The organic insulating layer 7 functions as a protective layer that protects the scanning line 1, signal line 2, electrical element 3 and the like. The organic insulating layer 7 also functions as a planarizing layer that planarizes the side of the flexible substrate 100 that faces the organic insulating layer 9. No bubbles are mixed in the organic insulating layer 7. Thus, the organic insulating layer 7 functions as an adhesion layer and allows the organic insulating layer 7 to be brought into good contact with the array substrate AR. The thickness T7 is not particularly limited, but is several micrometers, and preferably less than 10 μm.

Since bubbles are mixed in the organic insulating layer 9, the effective thickness of the organic insulating layer 9 can be reduced. The organic insulating layer 9 functions as a rigidity coordination layer. Compared with the case where the organic insulating layer 9 is a solid layer, the rigidity of the organic insulating layer 9 can be lowered, with the result that the flexible substrate 100 can be improved in its elongation rate and decreased in its stress. In the organic insulating layer 9, only the portion directly above the electrical element 3 may be a solid portion.

The organic insulating layer 9 also functions as a support layer that supports the array substrate AR. Therefore, the organic insulating layers 7 and 9 are laminated on the array substrate AR to make it possible to reduce various risks that may occur in the manufacturing process and handling. The thickness T9 is not particularly limited, but is preferably larger than the thickness T7 from the viewpoint of mixing bubbles, for example, 20 μm.

The organic insulating layer 8 and the organic insulating layer 10 function as support layers that support the insulating basement 4. Therefore, the strength of the flexible substrate 100 increases as a whole, and moisture and the like can be prevented from entering from below. In addition, the addition of the organic insulating layer 8 and the organic insulating layer 10 makes it possible to further reduce various risks that may occur in handling.

Next is a description of the relationship among the thickness, elastic modulus and rigidity of a solid organic insulating layer such as the organic insulating layers 7, 8 and 10. FIG. 6 is a table showing the relationship among the thickness, elastic modulus and rigidity of the organic insulating layer.

It is understood from FIG. 6 that the organic insulating layer decreases in its rigidity as the organic insulating layer decreases in its thickness. It is also understood that the organic insulating layer decreases in its rigidity as the organic insulating layer decreases in its elastic modulus. For example, when the elastic modulus of the organic insulating layer decreases by one order of magnitude, the rigidity thereof also decreases by one order of magnitude.

Therefore, in the first embodiment, the effective thickness of the organic insulating layer 9 can be reduced and the rigidity of the organic insulating layer 9 can be reduced by paying attention to the relationship between the thickness and rigidity of the organic insulating layer and by mixing bubbles. Since, moreover, the organic insulating layer 9 can be formed of the same material as the organic insulating layer 7, the organic insulating layer 7 and the organic insulating layer 9 can be formed with efficiency.

In addition, the organic insulating layer 9 can be formed without making the thickness T9 too small. The thickness T9 is a distance between both the main surfaces of the organic insulating layer 9 in the third direction d3. The mixture of bubbles makes it possible to set the sum (T7+T9) of the thickness T7 and the thickness T9 to a desired thickness or more while lowering the rigidity of the organic insulating layer 9. The manufacturing yield of the flexible substrate 100 can thus be increased. For example, in the manufacturing process of the flexible substrate 100, when a direct material including the array substrate AR is peeled from an indirect material such as a glass substrate by a technique such as laser lift off (LLO), the situations in which the organic insulating layer 7 is peeled from the array substrate AR and the organic insulating layer 9 is peeled from the organic insulating layer 7, can be lessened.

Next is a description of the relationship between the elongation rate and the amount of strain of the flexible substrate 100 when the elastic modulus of the organic insulating layer is changed. FIG. 7 is a graph showing variations of the amount of strain with respect to the elongation rate in the flexible substrate 100. FIG. 7 shows the results of simulation in which the flexible substrate 100 is elongated in the first direction d1.

As shown in FIG. 7, the amount of strain of the flexible substrate 100 is preferably small. This is because when the flexible substrate 100 is elongated, stress is hardly applied to the scanning line 1, the signal line 2 and the like. It is thus found that it is effective to lower the elastic modulus of the organic insulating layer in order to reduce the amount of strain of the flexible substrate 100.

If, however, the elastic modulus of the organic insulating layer is too low, various risks are likely to occur in handling. If the thickness of the organic insulating layer is increased, the risks can be reduced, but the thickness of the organic insulating layer is increased. Therefore, the thickness and elastic modulus of the organic insulating layer have only to be set in consideration of the above risks and the upper limit of the thickness of the organic insulating layer.

In the flexible substrate 100 according to the first embodiment configured as described above, the flexible substrate 100 includes the array substrate AR including the insulating basement 4 and the organic insulating layers 7 to 10. A plurality of bubbles are mixed in the organic insulating layer 9. The elastic modulus of each of the organic insulating layers 7 to 10 is lower than that of the insulating basement 4. Therefore, a flexible substrate capable of improving the elongation rate can be obtained.

First Modification of First Embodiment

Figure 8:
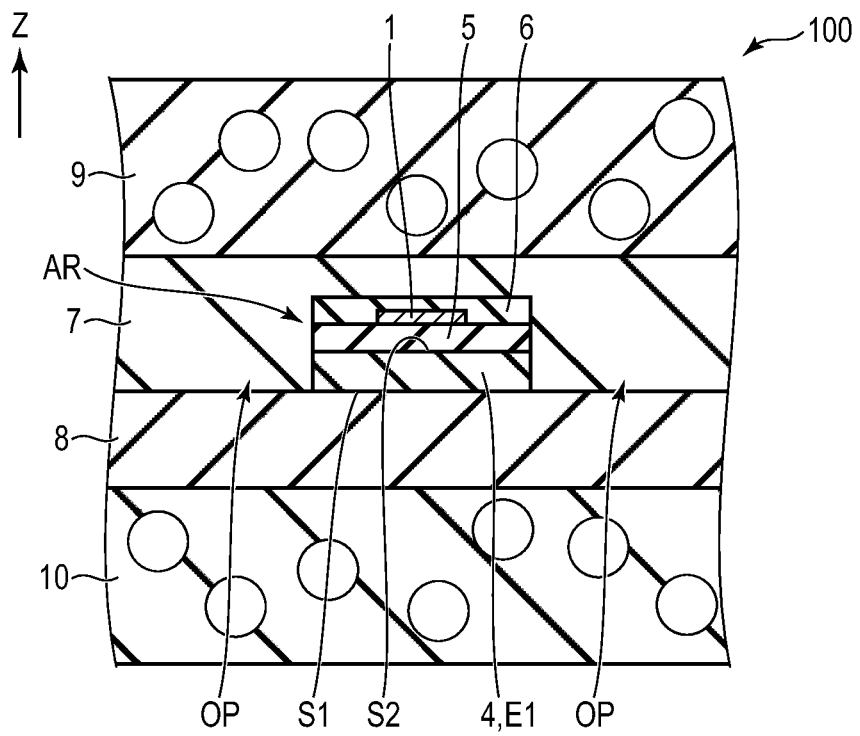
FIG. 8 is a sectional view showing part of a flexible substrate according to a first modification of the first embodiment.

Next is a description of a first modification to the first embodiment. FIG. 8 is a sectional view showing part of the flexible substrate 100 according to the first modification.

As shown in FIG. 8, the organic insulating layer 10 of the first modification is not a solid layer. The organic insulating layer 10 is configured in the same manner as the organic insulating layer 9, and a plurality of bubbles are mixed in the organic insulating layer 10. Compared with the first embodiment, the rigidity of the organic insulating layer 10 can be reduced, with the result that the elongation rate of the flexible substrate 100 can be improved further and the stress thereof can be reduced further. The organic insulating layers 7 and 9 and the organic insulating layers 8 and 10 are formed in the same manner. This makes it possible to balance the rigidity of the organic insulating layers located on both sides of the array substrate AR, and makes it difficult to apply undesired stress to the scanning lines 1, signal lines 2 and the like. Other than the above, the flexible substrate 100 of the first modification is configured in the same manner as that of the first embodiment.

The first modification brings about the same advantages as those of the first embodiment.

Second Modification of First Embodiment

Figure 9:
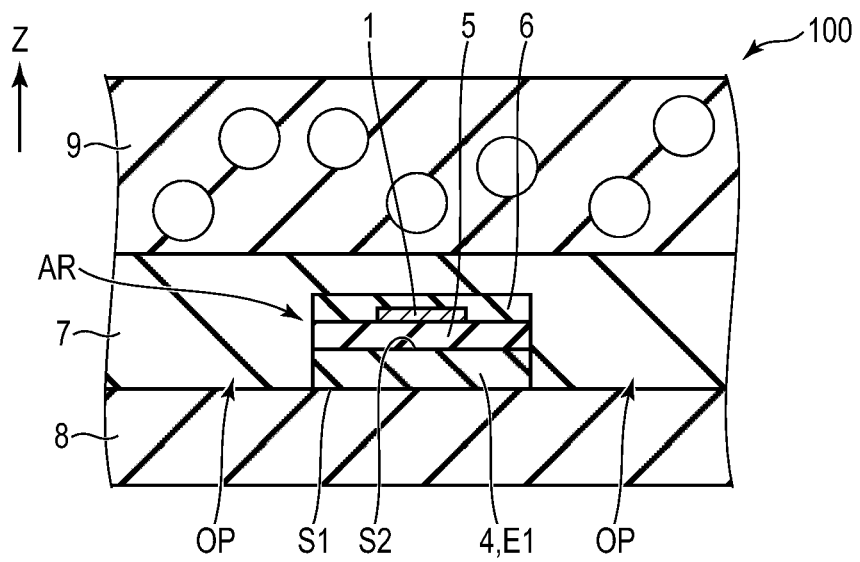
FIG. 9 is a sectional view showing part of a flexible substrate according to a second modification of the first embodiment.

Next is a description of a second modification to the first embodiment. FIG. 9 is a sectional view showing part of the flexible substrate 100 according to the second modification.

As shown in FIG. 9, the flexible substrate 100 of the second modification may be configured without including the organic insulating layer 10. Except for the above, the flexible substrate 100 of the second modification is configured in the same manner as that of the first embodiment.

The second modification brings about the same advantages as those of the first embodiment.

Third Modification of First Embodiment

Next is a description of a third modification to the first embodiment. FIG. 10 is a sectional view showing part of the flexible substrate 100 according to the third modification.

As shown in FIG. 10, the organic insulating layer 8 of the third modification is not a solid layer. A plurality of bubbles are mixed in the organic insulating layer 8. From the viewpoint of the neutral plane of the flexible substrate 100, it is preferable that the sum of the thickness T7 and the thickness T9 is equal to the sum of the thickness T4 and the thickness T8 in the area overlapping the scanning line 1 and the area overlapping the signal line 2 (T7+T9=T4+T8). Other than the above, the flexible substrate 100 of the third modification is configured in the same manner as that of the second modification.

The third modification brings about the same advantages as those of the first embodiment.

Fourth Modification of First Embodiment

Next is a description of a fourth modification to the first embodiment. In the flexible substrate 100 of the fourth modification, the organic insulating layer 9 is a solid layer, and bubbles may not be mixed in the organic insulating layer 9. In this case, the organic insulating layer 9 is formed of a material which differs from that of the organic insulating layer 7 and which has a lower elastic modulus than the organic insulating layer 7. Compared with the first embodiment described above, the thickness T9 of the fourth modification is increased. If the upper limit of the thickness of the organic insulating layer 7 need not be considered, the flexible substrate 100 may be configured as in the fourth modification.

Second Embodiment

Figure 11:
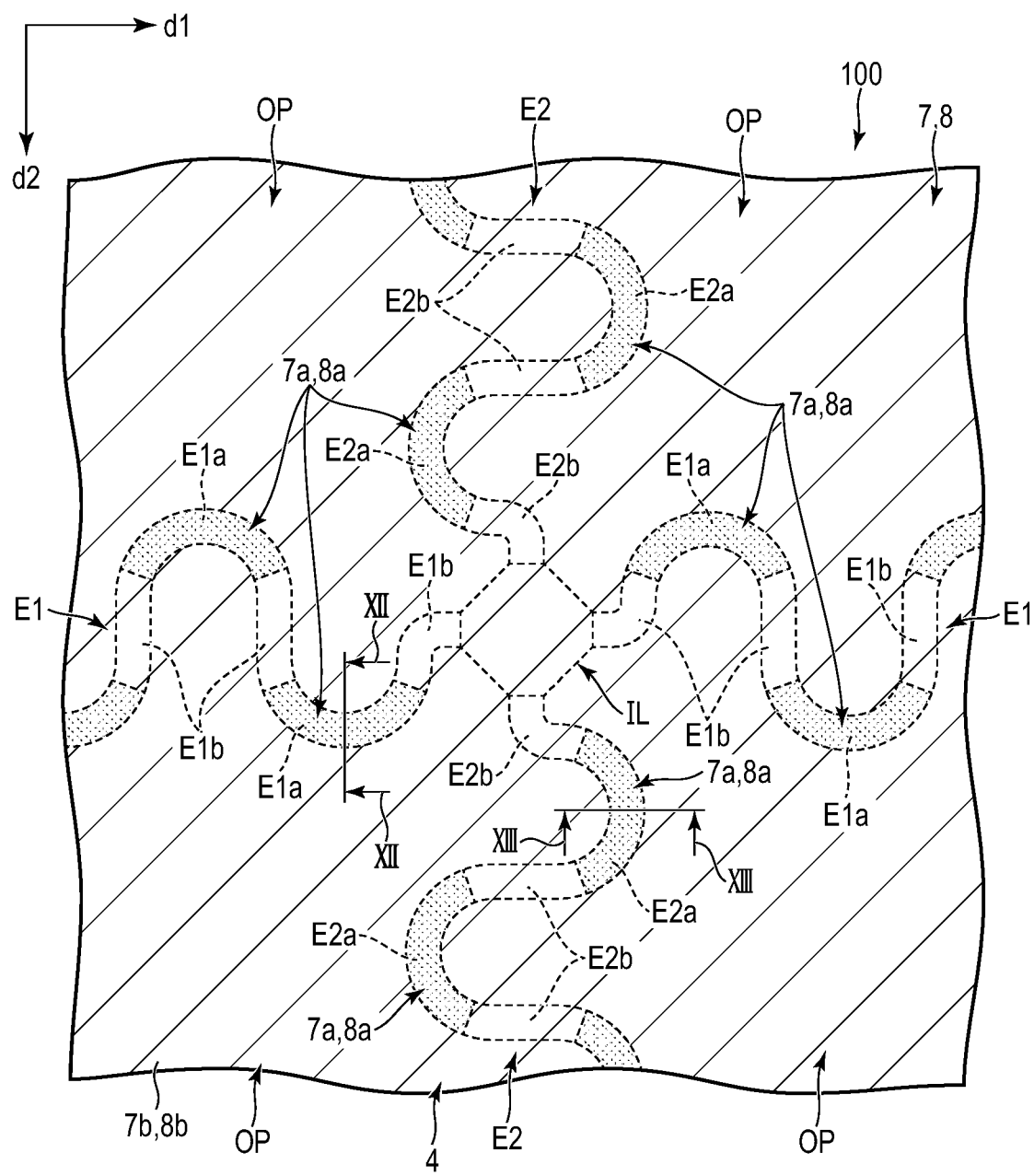
FIG. 11 is an enlarged plan view showing part of a flexible substrate according to a second embodiment.

Next is a description of a second embodiment. FIG. 11 is an enlarged plan view showing part of a flexible substrate 100 according to the second embodiment. FIG. 11 shows an insulating basement 4 and organic insulating layers 7 and 8. The flexible substrate 100 of the second embodiment differs from that of the first embodiment in the configuration other than the array substrate AR.

As shown in FIG. 11, the insulating basement 4 includes a plurality of islands IL, a plurality of extensions E1, a plurality of extensions E2 and a plurality of openings OP. Each of the extensions E1 and E2 is loosely bridged two islands IL. Each of the extensions E1 includes a plurality of curved first sections E1a and a second section E1b other than the first sections E1a. Each of the extensions E2 includes a plurality of curved first sections E2a and a plurality of second sections E2b other than the first sections E2a. The first sections E1a and E2a correspond to the maximum strained portions in the elongated portion of the wiring line.

The organic insulating layer 7 includes a plurality of first portions 7a superposed on the first sections E1a and E2a of the extensions E1 and E2 and a second portion 7b other than the first portions 7a. Each of the first portions 7a overlaps its corresponding one of the first sections E1a and E2a. The second portion 7b has elasticity and flexibility. In FIG. 11, the first portions 7a are dotted and the second portion 7b is hatched.

The organic insulating layer 8 includes a plurality of third portions 8a superposed on the first sections E1a and E2a of the extensions E1 and E2 and a fourth portion 8b other than the third portions 8a. Each of the third portions 8a overlaps its corresponding one of the first sections E1a and E2a. The fourth portion 8b has elasticity and flexibility. In FIG. 11, the third portions 8a are dotted like the first portions 7a, and the fourth portion 8b is hatched like the second portion 7b.

Figure 12:
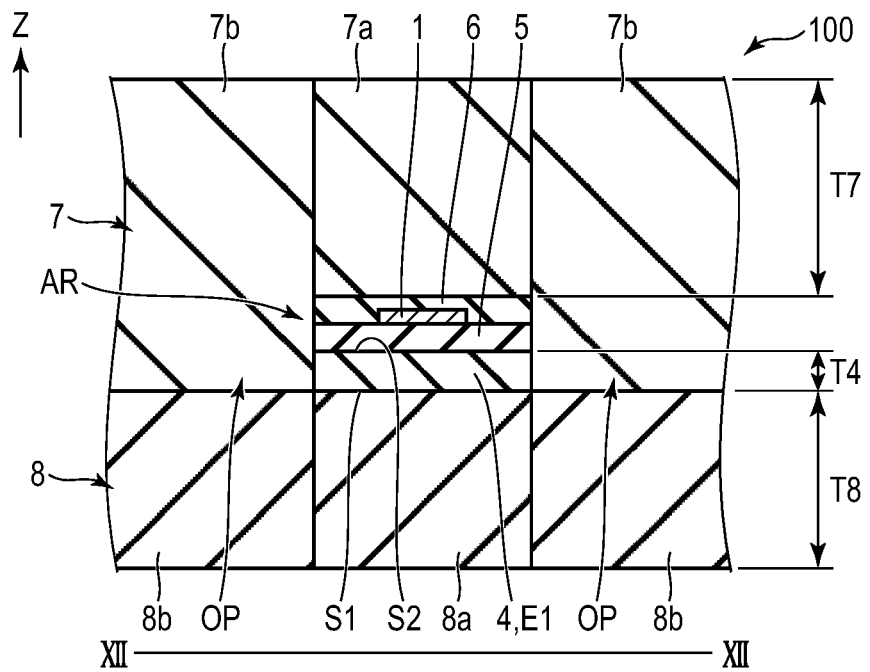
FIG. 12 is a sectional view showing part of the flexible substrate along line XII-XII of FIG. 11.

FIG. 12 is a sectional view showing part of the flexible substrate 100 along line XII-XII of FIG. 11. As shown in FIG. 12, the organic insulating layer 7 is opposed to the second surface S2 of the extension E1 (insulating basement 4) and is directly fixed to the array substrate AR. The organic insulating layer 7 is closely adhered the array substrate AR. Note that the organic insulating layer 7 may indirectly be fixed to the array substrate AR. In this case, a third organic insulating layer, which is formed of a material having a lower elastic modulus than that of the insulating basement 4, may be interposed between the array substrate AR and the organic insulating layer 7.

The organic insulating layer 7 is a solid layer. The second portion 7b has rigidity that is lower than that of the first portions 7a. In the second embodiment, the second portion 7b is formed of a material whose elastic modulus is lower than that of the first portions 7a. Note that the second portion 7b is formed of a material whose elastic modulus is lower than that of the insulating basement 4.

The organic insulating layer 8 is opposed to the first surface S1 of the extension E1 (insulating basement 4) and is directly fixed to the array substrate AR. The organic insulating layer 8 is closely adhered the array substrate AR. Note that the organic insulating layer 8 may indirectly be fixed to the array substrate AR. In this case, a third organic insulating layer, which is formed of a material having a lower elastic modulus than that of the insulating basement 4, may be interposed between the array substrate AR and the organic insulating layer 8.

The organic insulating layer 8 is a solid layer. The fourth portion 8b has rigidity that is lower than that of the third portions 8a. In the second embodiment, the fourth portion 8b is formed of a material whose elastic modulus is lower than that of the third portions 8a. Note that the fourth portion 8b is formed of a material whose elastic modulus is lower than that of the insulating basement 4.

Figure 13:
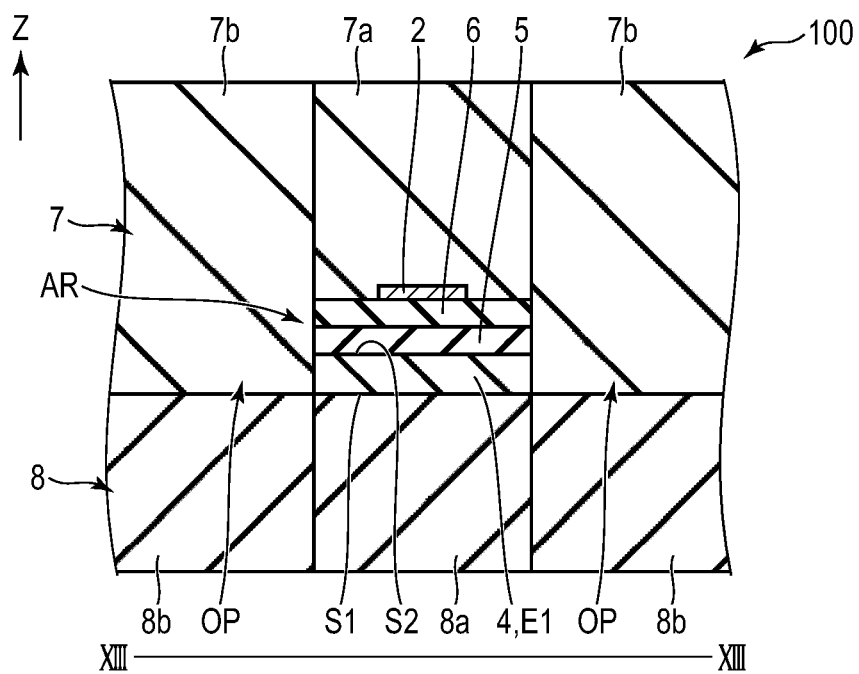
FIG. 13 is a sectional view showing part of the flexible substrate along line XIII-XIII of FIG. 11.

FIG. 13 is a sectional view showing part of the flexible substrate 100 along line XIII-XIII of FIG. 11. As shown in FIG. 13, the organic insulating layer 7 is opposed to the second surface S2 of the extension E2 and the organic insulating layer 8 is opposed to the first surface S1 of the extension E2. The second portion 7b (organic insulating layer 7) and the fourth portion 8b (organic insulating layer 8) are closely adhered each other through a plurality of openings OP.

As shown in FIGS. 12 and 13, the thickness T7 of the organic insulating layer 7 is equal to the sum of the thickness T4 of the insulating basement 4 and the thickness T8 of the organic insulating layer 8 in the area overlapping the scanning line 1 and the area overlapping the signal line 2 (T7=T4+T8). However, unlike in the second embodiment, the thickness T7 may not be equal to the sum of the thicknesses T4 and T8.

Figure 14:
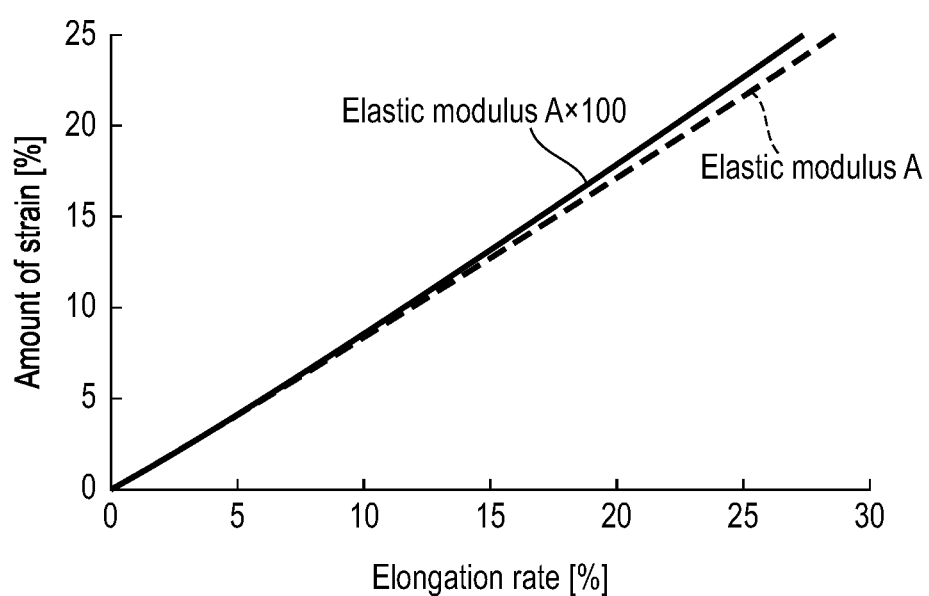
FIG. 14 is a graph showing variations of the amount of strain with respect to the elongation rate of the flexible substrate when the elastic modulus of first and third portions is changed.

Next is a description of the relationship between the elongation rate and the amount of strain of the flexible substrate 100 when the elastic modulus of each of the first portion 7a and the third portion 8a is changed. FIG. 14 is a graph showing variations of the amount of strain with respect to the elongation rate in the flexible substrate 100 when the elastic modulus of each of the first and third portions 7a and 8a is changed. FIG. 14 shows the results of simulation in which the flexible substrate 100 is elongated in the first direction d1.

It can be seen from FIG. 14 that the amount of strain changes as the elastic modulus changes.

According to the flexible substrate 100 according to the second embodiment configured as described above, the flexible substrate 100 includes an array substrate AR having an insulating basement 4 and an organic insulating layer 7. Each of the extensions E1 includes a plurality of curved first sections E1a and a plurality of second sections E1b other than the first sections E1a. Each of the extension E2 includes a plurality of curved first sections E2a and a plurality of second section E2b other than the first sections E2a. The organic insulating layer 7 includes a plurality of first portions 7a overlapping the first sections E1a and E2a, and a second portion 7b other than the first portions 7a.

The second portion 7b has rigidity that is lower than that of the first portion 7a. The second portion 7b has rigidity that is lower than that of the insulating basement 4. Therefore, the flexible substrate 100 can be improved in its elongation rate.

The first portion 7a has rigidity that is higher than that of the second portion 7b. Thus, when stress is applied to the flexible substrate 100 by elongating and twisting the flexible substrate 100, an area overlapping the curved first sections E1a and E2a can be prevented from being deformed. Accordingly, the amount of strain of the curved portions of the scanning lines 1 and the curved portions of the signal lines 2 can be reduced, and the scanning lines 1 and the signal lines 2 can be prevented from being disconnected, with the result that the flexible substrate 100 can be increased in product reliability.

In the second embodiment, not only the organic insulating layer 7 but also the organic insulating layer 8 includes a plurality of third portions 8a and a fourth portion 8b. The organic insulating layer 7 and the organic insulating layer 8 are configured in the same manner. This makes it possible to balance the rigidity of the organic insulating layers located on both sides of the array substrate AR and makes it difficult to apply undesired stress to the scanning lines 1, the signal lines 2 and the like.

In the areas overlapping the scanning and signal lines 1 and 2, the thickness T7 is preferably equal to the sum of the thicknesses T4 and T8 (T7=T4+T8). If the neutral plane of the flexible substrate 100 is controlled by the organic insulating layers 7 and 8, stress can hardly be applied to the scanning lines 1 and the signal lines 2.

First Modification of Second Embodiment

Next is a description of a first modification to the second embodiment described above. FIG. 15 is an enlarged plan view showing part of a flexible substrate 100 according to the first modification.

As shown in FIG. 15, in the first modification, a plurality of first sections E1a and E2a are each bent. First portions 7a and the third portions 8a overlap the bent portions of extensions E1 and E2. Other than the above, the flexible substrate 100 of the first modification is configured in the same manner as that of the second embodiment.

The first modification can also bring about the same advantages as those of the second embodiment described above. For example, the amount of strain of the bent portions of the scanning and signal lines 1 and 2 can be reduced, and the scanning and signal lines 1 and 2 can be prevented from being disconnected, with the result that the flexible substrate 100 can be increased in product reliability.

Second Modification of Second Embodiment

Figure 16:
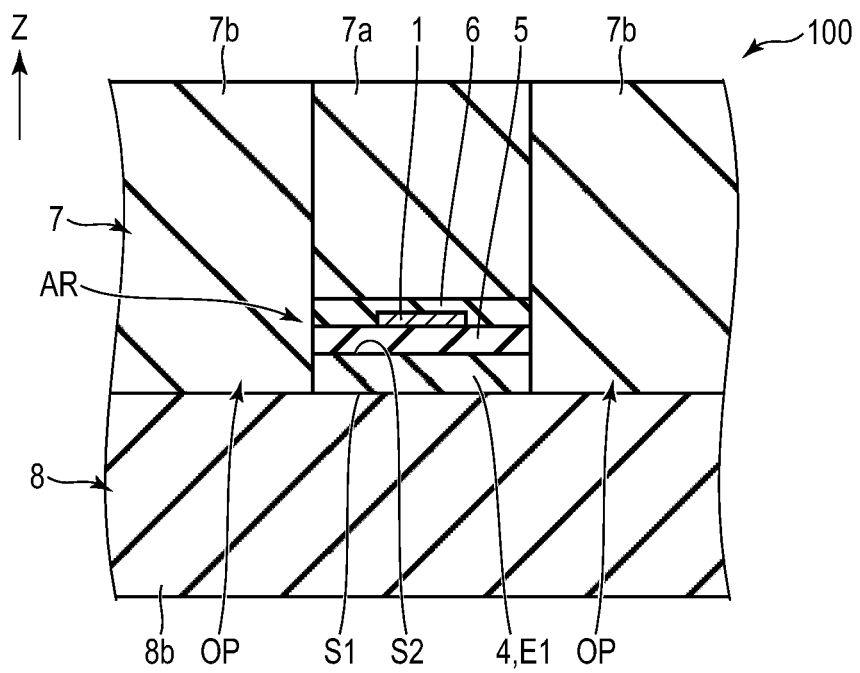
FIG. 16 is a sectional view showing part of a flexible substrate according to a second modification of the second embodiment.

Next is a description of a second modification to the second embodiment described above. FIG. 16 is a sectional view showing part of a flexible substrate 100 according to the second modification.

As shown in FIG. 16, an organic insulating layer 8 is formed without the third portion 8a. The organic insulating layer 8 is formed of a fourth portion 8b, and the fourth portion 8b overlaps a plurality of first sections E1a and E2a. Other than the above, the flexible substrate 100 of the second modification is configured in the same manner as that of the second embodiment. For example, the organic insulating layer 7 includes a first portion 7a and a second portion 7b. Thus, the second modification can also bring about the same advantages as those of the second embodiment described above.

Unlike in the second modification of the second embodiment, the organic insulating layer 7 may be formed without the first portion 7a. The organic insulating layer 7 is formed of a second portion 7b, and the second portion 7b overlaps the first sections E1a and E2a. The organic insulating layer 8 includes a third portion 8a and a fourth portion 8b. In this case, too, the same advantages as those of the second embodiment can be obtained.

Third Modification of Second Embodiment

Figure 17:
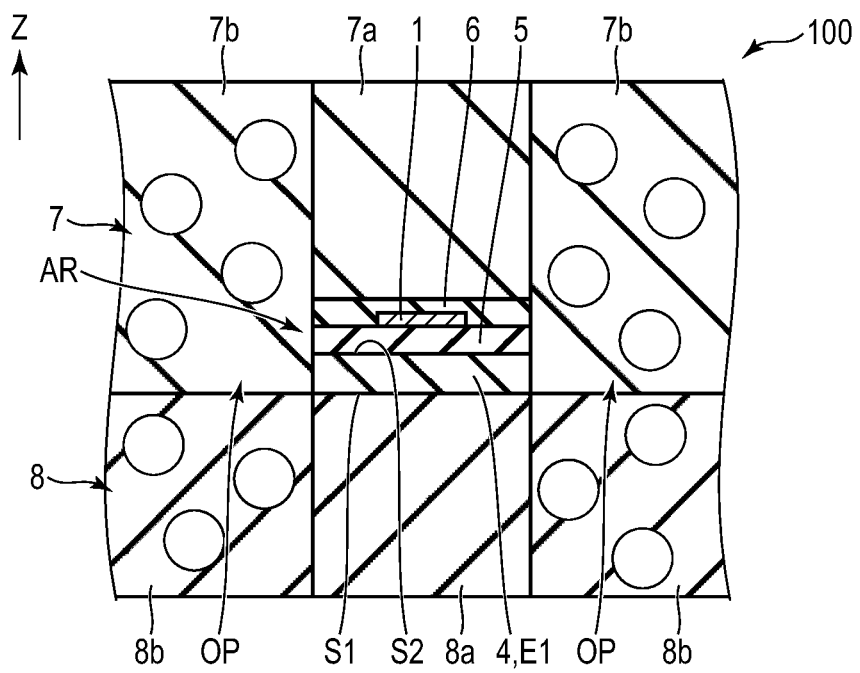
FIG. 17 is a sectional view showing part of a flexible substrate according to a third modification of the second embodiment.

Next is a description of a third modification to the second embodiment described above. FIG. 17 is a sectional view showing part of a flexible substrate 100 according to the third modification.

As shown in FIG. 17, in the organic insulating layer 7, first portions 7a and the second portion 7b are formed of the same material. The first portion 7a is a solid portion, and a plurality of bubbles are mixed in the second portion 7b. In the organic insulating layer 8, third portions 8a and the fourth portion 8b are formed of the same material. The third portion 8a is a solid portion, and a plurality of bubbles are mixed in the fourth portion 8b.

Other than the above, the flexible substrate 100 of the third modification is configured in the same manner as that of the second embodiment. Therefore, the third modification can also bring about the same advantages as those of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
an array substrate including an insulating basement having a first surface and a second surface opposed to the first surface;
a first organic insulating layer which is located alongside the second surface and which is closely adhered the array substrate; and
a second organic insulating layer closely adhered the first organic insulating layer, the first organic insulating layer being located between the array substrate and the second organic insulating layer,
a plurality of bubbles being mixed in the second organic insulating layer,
the second organic insulating layer having an elastic modulus that is lower than that of the insulating basement.

2. The flexible substrate of claim 1, wherein
the first organic insulating layer is a solid layer.

3. The flexible substrate of claim 1, wherein
the insulating basement includes a plurality of islands each constituting part of the first surface and part of the second surface, a plurality of extensions each constituting part of the first surface and part of the second surface, and a plurality of openings each surrounded by the islands and the extensions, and
the extensions are each located between two of the islands.

4. The flexible substrate of claim 3, wherein
the array substrate further includes a plurality of wiring lines provided alongside the second surface of the insulating basement, and a plurality of electrical elements each provided alongside the second surface of the insulating basement and electrically connected to a corresponding wiring line of the wiring lines,
the lines each extend along the islands and the extensions, and
the electrical elements are each provided alongside the second surface of a corresponding island of the islands.

5. The flexible substrate of claim 1, wherein
the first organic insulating layer and the second organic insulating layer are formed of a same material.

6. The flexible substrate of claim 1, wherein
the second organic insulating layer has a thickness that is greater than that of the first organic insulating layer.

7. The flexible substrate of claim 1, further comprising:
a third organic insulating layer which is located alongside the first surface and which is closely adhered the array substrate; and
a fourth organic insulating layer closely adhered the third organic insulating layer, the third organic insulating layer being located the array substrate and the fourth organic insulating layer,
wherein
a plurality of bubbles are mixed in the fourth organic insulating layer, and
the fourth organic insulating layer has an elastic modulus that is lower than that of the insulating basement.

8. The flexible substrate of claim 7, wherein
the third organic insulating layer is a solid layer.

9. The flexible substrate of claim 7, wherein
a sum of a thickness of the first organic insulating layer and a thickness of the second organic insulating layer is equal to a sum of a thickness of the insulating basement, a thickness of the third organic insulating layer and a thickness of the fourth organic insulating layer.

10. A flexible substrate comprising:
an array substrate including an insulating basement having a first surface and a second surface opposed to the first surface; and
a first organic insulating layer which is located alongside the second surface and which is fixed to the array substrate directly or indirectly,
the insulating basement including a plurality of islands each constituting part of the first surface and part of the second surface, a plurality of extensions each constituting part of the first surface and part of the second surface, and a plurality of openings each surrounded by the islands and the extensions,
the extensions being each located between two of the islands and each include a curved or flexed first section and a second section other than the first section,
the first organic insulating layer including a plurality of first portions which overlap the first sections of the extensions and a second portion other than the first portions,
the second portion having rigidity that is lower than that of the first portions.

11. The flexible substrate of claim 10, wherein
the second portion is formed of a material whose elastic modulus is lower than that of the first portions.

12. The flexible substrate of claim 10, wherein
the first portions and the second portion are formed of a same material,
the first portions are each a solid portion, and
a plurality of bubbles are mixed in the second portion.

13. The flexible substrate of claim 10, wherein
the first organic insulating layer is closely adhered the array substrate.

14. The flexible substrate of claim 10, wherein
the array substrate further includes a plurality of wiring lines provided alongside the second surface of the insulating basement, and a plurality of electrical elements each provided alongside the second surface of the insulating basement and electrically connected to a corresponding wiring line of the wiring lines,
the wiring lines each extend along the islands and the extensions, and
the electrical elements are each provided alongside the second surface of a corresponding island of the islands.

15. The flexible substrate of claim 10, further comprising
a second organic insulating layer opposed to the first surface and fixed to the array substrate directly or indirectly,
wherein
the second organic insulating layer includes a plurality of third portions which overlap the first sections of the extensions and a fourth portion other than the third portions, and
the fourth portion has rigidity that is lower than that of the third portions.

16. The flexible substrate of claim 15, wherein
a thickness of the first organic insulating layer is equal to a sum of a thickness of the insulating basement and a thickness of the second organic insulating layer.

\* \* \* \* \*